(12) United States Patent
Li et al.

(10) Patent No.: US 7,812,669 B2
(45) Date of Patent: Oct. 12, 2010

(54) PREDISTORTION APPARATUS, SYSTEM, AND METHOD

(75) Inventors: Hui Li, Beijing (CN); Zhan Shi, Beijing (CN); Jianmin Zhou, Beijing (CN)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/485,456

(22) Filed: Jun. 16, 2009

(65) Prior Publication Data

US 2009/0309657 A1 Dec. 17, 2009

(30) Foreign Application Priority Data

Jun. 17, 2008 (CN) .......................... 2008 1 0109783

(51) Int. Cl.
*H03F 1/26* (2006.01)
(52) U.S. Cl. .................. 330/149; 330/107; 330/278
(58) Field of Classification Search .................. 330/149, 330/107, 278
See application file for complete search history.

(56) References Cited

U.S. PATENT DOCUMENTS

| | | | |
|---|---|---|---|
| 5,959,500 A * | 9/1999 | Garrido ...................... 330/151 |
| 6,240,278 B1 | 5/2001 | Midya et al. | |
| 6,600,792 B2 | 7/2003 | Antonio et al. | |
| 6,731,168 B2 | 5/2004 | Hedberg et al. | |
| 6,907,025 B2 * | 6/2005 | Demir et al. ................. 370/342 |
| 6,934,341 B2 * | 8/2005 | Sahlman ..................... 375/297 |
| 7,613,251 B2 * | 11/2009 | Shako et al. ................ 375/296 |
| 2005/0195030 A1 * | 9/2005 | Okazaki et al. ............. 330/149 |

* cited by examiner

*Primary Examiner*—Patricia Nguyen
(74) *Attorney, Agent, or Firm*—Hanify & King, P.C.

(57) ABSTRACT

The present invention discloses a predistortion apparatus, a predistortion system and a predistortion method. The predistorter comprises a modular value calculating section, for performing modular arithmetic on an information source input signal inputted from an information source; an orthogonal lookup table value acquiring section, for searching N stored lookup tables orthogonal to one another, finding out corresponding output of each lookup table in accordance with the modular value of the information source input signal, and acquiring N lookup table values, wherein N is an integer greater than 1; a multiplying section, for multiplying the N lookup table values acquired by the orthogonal lookup table value acquiring section with N amplitude adjustment factors to obtain N amplitude adjustment values, and multiplying the N lookup table values with N phase adjustment factors to obtain N phase adjustment values; and a summating section, for summating the N amplitude adjustment values to obtain an amplitude predistortion value, and summating the N phase adjustment values to obtain a phase predistortion value.

10 Claims, 5 Drawing Sheets

US 7,812,669 B2

PREDISTORTION APPARATUS, SYSTEM, AND METHOD

FIELD OF THE INVENTION

The present invention relates to radio transmitters, and more precisely to RF power amplification in a transmitter.

BACKGROUND OF THE INVENTION

With the development of communications system, various modulation modes of high frequency spectrum efficiency are widely used. These modulation signals have unsteady envelopes that put very high demands on linearity of the power amplifier inside the transmitter. The method of linearization therefore becomes an indispensable technique. Due to its simplicity, flexibility and low cost, digital baseband predistortion has become an effective method of power amplification linearization.

Predistortion method employing scalar information (such as the out-band power and in-band/out-band power ratios of a power-amplified output signal) as the optimization objective can avoid influences of such factors as the delay of the feedback loop and I/O unbalancing, and is more simple and effective.

FIG. 1 is a block diagram illustrating the principles of a power amplification apparatus employing a prior art method. As shown in FIG. 1, after baseband information source information $x(n)$ from an information source 100 passes through a lookup table predistorter 102, an amplitude predistortion value $y_{am}(|x(n)|)$ and a phase predistortion value $y_{pm}(|x(n)|)$ are obtained, and a multiplier 103 multiples the baseband information source information with the predistortion values to obtain a predistorted signal $x(n) \cdot y_{am}(|x(n)|) \cdot \exp(j \cdot y_{pm}(|x(n)|))$, which is converted into an analogue signal by a digital-to-analogue (D/A) converter 104. This signal is up-converted by an up-converter 105 into an RF signal and then inputted into a power amplifier 106. The signal amplified by the power amplifier 106 is transmitted by an antenna. At the same time, partial signal outputted from power amplification is down-converted by a down-converter 107 to be fed back to an analogue-to-digital converter 108, which samples the digital signal to obtain a fed-back digital baseband signal of the output of the power amplifier. The baseband signal is analyzed by digital signal processing technology in an out-band power calculating module 109 to obtain the out-band power value of this digital baseband signal. Subsequently in a module 110, the out-band power value is optimized as a target function, and parameters of the predistorter are updated by using an optimization algorithm, so as to realize an adaptive predistortion process.

One essential problem in the algorithm rests in using what kind of structure and algorithm to realize the lookup table predistorter as well as update of the predistortion lookup tables used therein.

U.S. Pat. No. 6,600,792 selects predistortion values at several amplitude points as predistortion parameters. These parameters are discrete points on a predistortion curve. These discrete points are updated point by point during the process of parameter update, and a predistortion lookup table is entirely generated by the method of linear interpolation or spline interpolation. With regard to this method, when there are many items in the lookup table, interpolation operation leads to huge computational amount, which is difficult for real-time implementation. U.S. Pat. No. 6,731,168 prestores two lookup tables one under high temperature condition and another under low temperature condition, adaptively controls interpolation factors in accordance with feedback temperature information, and performs interpolation between the two tables to obtain the current predistortion table. Although this method requires few predistortion parameters, the predistortion table obtained thereby has relatively low degree of freedom and inferior flexibility. U.S. Pat. No. 6,240,278 makes use of orthogonal polynomials as predistortion functions, and achieves adaptability by updating coefficients of the orthogonal polynomials. The orthogonal polynomials required in this method depend on statistical characteristics of the input signals, and corresponding orthogonal polynomials should be calculated anew under different characteristics of the input signals. There are some other algorithms that calculate a set of predistortion parameters by measuring power amplification characteristics under various environmental conditions, and select corresponding predistortion parameters according to the current operating status. These methods also have inferior flexibility while requiring more storage capacity.

SUMMARY OF THE INVENTION

The present invention is proposed in view of these problems existent in the prior art, and provides a predistortion apparatus and a method for acquiring predistortion values to remove one or more defects inherent in the prior art, and to provide at least one advantageous choice.

In order to achieve the above objectives, the present application provides the following aspects.

Aspect 1: A predistorter comprises a modular value calculating section, for performing modular arithmetic on an information source input signal inputted from an information source; an orthogonal lookup table value acquiring section, for searching N stored lookup tables orthogonal to one another, finding out corresponding output of each lookup table in accordance with the modular value of the information source input signal, and acquiring N lookup table values, wherein N is an integer greater than 1; a multiplying section, for multiplying the N lookup table values acquired by the orthogonal lookup table value acquiring section with N amplitude adjustment factors to obtain N amplitude adjustment values, and multiplying the N lookup table values with N phase adjustment factors to obtain N phase adjustment values; and a summating section, for summating the N amplitude adjustment values to obtain an amplitude predistortion value, and summating the N phase adjustment values to obtain a phase predistortion value.

Aspect 2: The predistorter according to Aspect 1, wherein the N lookup tables orthogonal to one another are obtained by performing singular value decomposition (SVD) on an input matrix.

Aspect 3: The predistorter according to Aspect 2, wherein the input matrix is obtained by calculating in accordance with a matrix consisting of a predistortion characteristic control essential point vector and high-order powers thereof and a matrix consisting of a representative modular value vector of the information source signal and high-order powers thereof, wherein the high-order powers only include even powers or include not only odd powers but also even powers.

Aspect 4: The predistorter according to Aspect 1, wherein each lookup table is marked with a set of lookup table essential output values determined by every predistortion characteristic control essential point; the predistorter further comprises an amplitude adjustment factor calculating section, a phase adjustment factor calculating section, an amplitude predistortion parameter storing section and a phase predistortion parameter storing section; wherein the amplitude adjustment factor calculating section makes inner product of amplitude predistortion parameters stored in the amplitude predistortion parameter storing section and a vector composed of one set of lookup table essential output values in each lookup table, respectively, to obtain each of the amplitude adjustment factors with regard to each table; the phase adjustment factor calculating section makes inner product of phase predistortion parameters stored in the phase predistortion parameter storing section and a vector composed of one set of lookup table essential output values in each lookup table, respectively, to obtain each of the phase adjustment factors with regard to each table; the amplitude predistortion parameters are one set of desired amplitude predistortion values at each predistortion characteristic control essential point; and the phase predistortion parameters are one set of desired phase predistortion values at each predistortion characteristic control essential point.

Aspect 5: A predistortion system comprises the predistorter according to Aspect 1; an out-of-band power calculating unit, for calculating a feedback out-of-band power value of a signal having been performed with power amplification; and an adjustment factor updating unit, for updating the amplitude adjustment factors and the phase adjustment factors of the predistorter in accordance with the out-of-band power value calculated by the out-of-band power calculating unit.

Aspect 6: The predistortion system according to Aspect 5, wherein in the predistorter each lookup table is marked with a set of lookup table essential output values determined by every predistortion characteristic control essential point; the predistorter further comprises an amplitude adjustment factor calculating section, a phase adjustment factor calculating section, an amplitude predistortion parameter storing section and a phase predistortion parameter storing section; wherein the amplitude adjustment factor calculating section makes inner product of amplitude predistortion parameters stored in the amplitude predistortion parameter storing section and a vector composed of one set of lookup table essential output values in each lookup table, respectively, to obtain each of the amplitude adjustment factors with regard to each table; the phase adjustment factor calculating section makes inner product of phase predistortion parameters stored in the phase predistortion parameter storing section and a vector composed of one set of lookup table essential output values in each lookup table, respectively, to obtain each of the phase adjustment factors with regard to each table; the adjustment factor updating unit updates the amplitude predistortion parameters and the phase predistortion parameters.

Aspect 7: The predistortion system according to Aspect 6, wherein the adjustment factor updating unit updates the amplitude predistortion parameters and the phase predistortion parameters in accordance with a gradient descent method or a direct search method.

Aspect 8: A predistorting method comprises performing modular arithmetic on an information source input signal inputted from an information source; searching N stored lookup tables orthogonal to one another, finding out corresponding output of each lookup table in accordance with the modular value of the information source input signal, and acquiring N lookup table values, wherein N is an integer greater than 1; multiplying the N lookup table values with N amplitude adjustment factors to obtain N amplitude adjustment values, and multiplying the N lookup table values with N phase adjustment factors to obtain N phase adjustment values; and summating the N amplitude adjustment values to obtain an amplitude predistortion value, and summating the N phase adjustment values to obtain a phase predistortion value.

Aspect 9: The predistorting method according to Aspect 8, wherein the N lookup tables orthogonal to one another are obtained by performing singular value decomposition (SVD) on an input matrix.

Aspect 10: The predistorting method according to Aspect 8, wherein the input matrix is obtained by calculating in accordance with a matrix consisting of a predistortion characteristic control essential point vector and high-order powers thereof and a matrix consisting of a representative modular value vector of the information source signal and high-order powers thereof, wherein the high-order powers only include even powers or include not only odd powers but also even powers.

Different from prior art methods, the apparatus and method according to the present invention need not perform interpolation operation to calculate the contents of the lookup tables, and are therefore relatively low in computational complexity. The predistorter according to the present invention as synthesized based on the orthogonal lookup tables has great degree of freedom and excellent flexibility. At the same time, the orthogonal lookup tables obtained in the present invention are irrelevant to statistical characteristics of input signals. Moreover, tendency and scope of changes of the predistortion parameters can be controlled by priori knowledge of changes in the power amplification characteristics with temperature and time.

EXPLANATIONS OF THE ACCOMPANYING DRAWINGS

Other objectives, features and advantages of the present invention will become apparent through detailed explanations of the present invention with reference to the accompanying drawings. In the drawings.

SPECIFIC EMBODIMENTS FOR CARRYING OUT THE INVENTION

Figure 1:
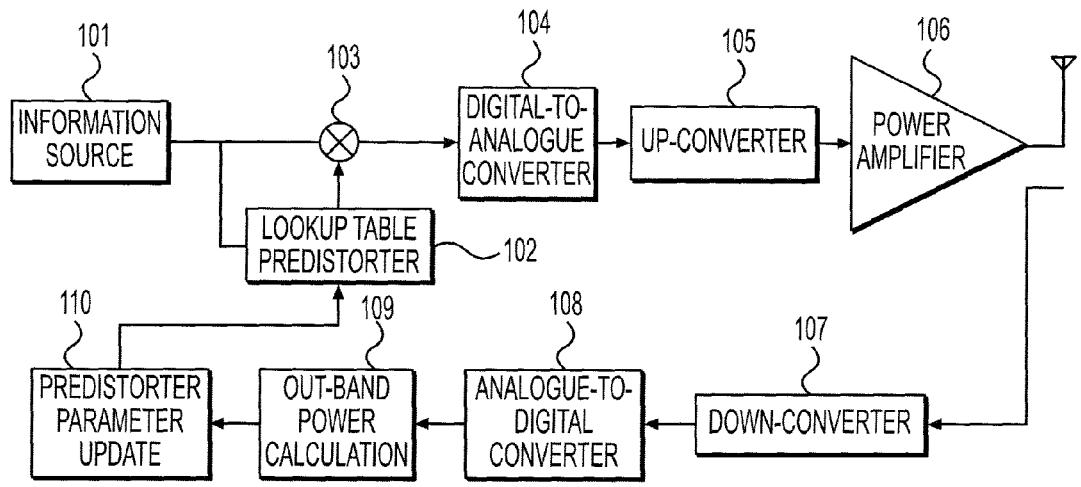
FIG. 1 is a schematic block diagram illustrating the principles of a power amplification apparatus employing a prior art method.

The present invention is described in greater detail below with reference to the accompanying drawings. For the sake of clarity and brevity, descriptions of prior art component parts that may cause unclarities to the present invention are omitted. In addition, identical or similar component parts in the present invention are described with the help of the same reference numerals, and repetitive descriptions thereof are omitted.

First of all, the present invention provides a predistorter that can be used to replace the lookup table predistorter 102 as shown in FIG. 1.

Figure 2:
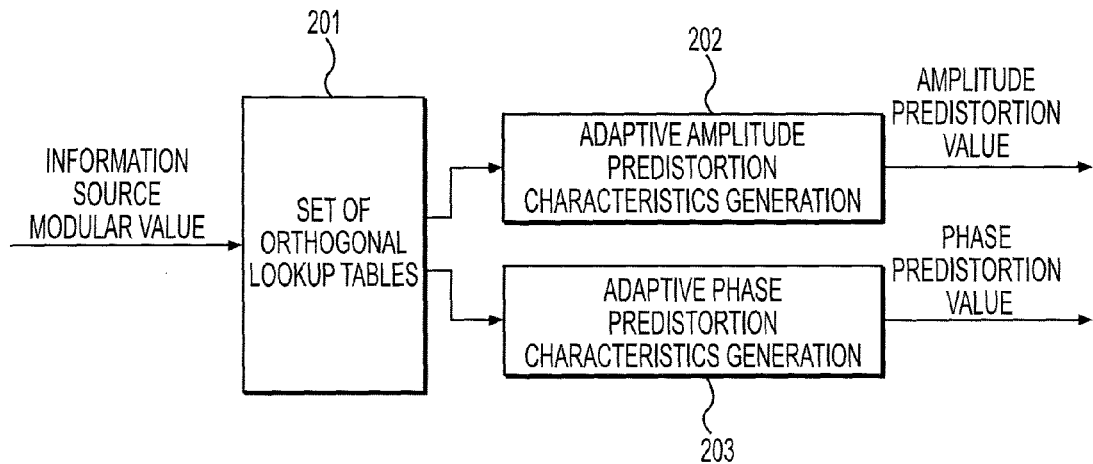
FIG. 2 is a schematic view illustrating the principles of a predistorter according to one embodiment of the present invention.

FIG. 2 is a schematic view illustrating the principles of the predistorter according to one embodiment of the present invention. As shown in FIG. 2, the present invention uses a set of lookup tables 201 orthogonal to one another. This set of lookup tables does not have to be updated, and serves as bases for amplitude predistortion and phase predistortion. Modular value detection is performed on an information source input signal to find the lookup table corresponding thereto, and multiplication and addition operations are performed by using defined predistortion parameters to obtain the amplitude predistortion value and the phase predistortion value (see modules 202 and 203). The predistortion parameters are selected from the amplitude predistortion value and phase predistortion value at several amplitude values, and the parameter values of the predistorter are updated during the process of adaptive update to reduce the out-band power of the power-amplified output signal.

Figure 3:
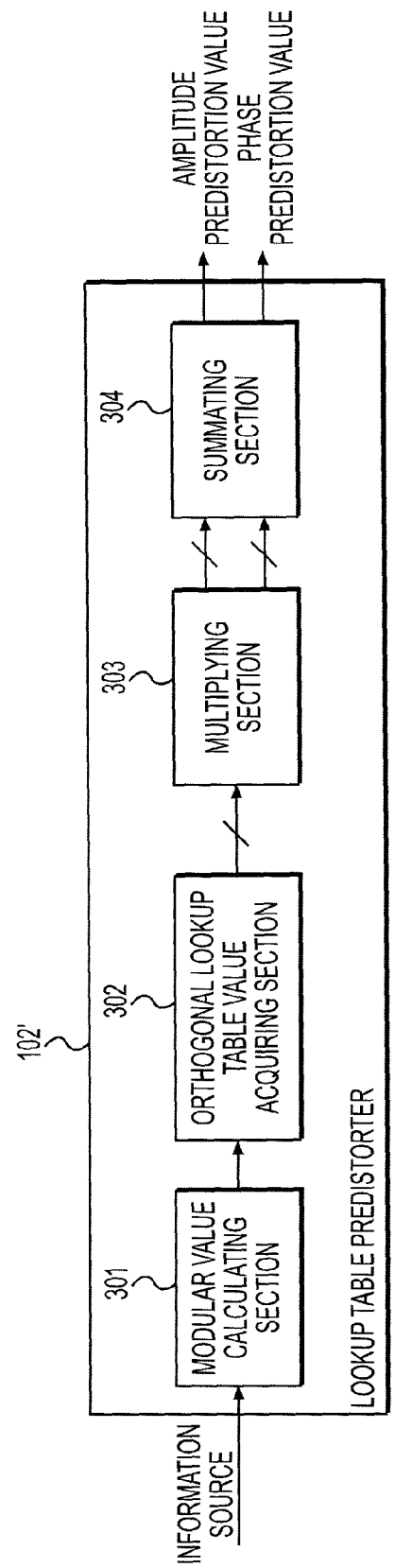
FIG. 3 is a block diagram schematically illustrating the structure of a predistorter according to one embodiment of the present invention.

FIG. 3 is a block diagram schematically illustrating the structure of a predistorter according to one embodiment of the present invention. As shown in FIG. 3, the predistorter 102' according to one embodiment of the present invention includes a modular value calculating section 301, an orthogonal lookup table value acquiring section 302, a multiplying section 303 and a summating section 304. The modular value calculating section 301 acquires the modulus of the information source signal inputted from the information source 101. If a complex signal inputted at timing n is $x(n)=x_i(n)+j \cdot x_q(n)$, the output of the modular value calculating section 301 is $\sqrt{x_i^2(n)+x_q^2(n)}$, i.e., the amplitude value of the inputted complex signal. The orthogonal lookup table acquiring section 302 searches for, based on the modular value of the inputted information source signal as calculated by the modular value calculating section 301, N stored lookup tables orthogonal to one another to find out the output of each table that corresponds to the modular value, so as to obtain the values of the N lookup tables. The multiplying section 303 multiplies the values of the lookup tables with N amplitude adjustment factors to obtain N amplitude adjustment values. The multiplying section 303 further multiplies the values of the lookup tables with N phase adjustment factors to obtain N phase adjustment values. The summating section 304 adds the N amplitude adjustment values to obtain the amplitude predistortion value, and further adds the N phase adjustment values to obtain the phase predistortion value.

Figure 4:
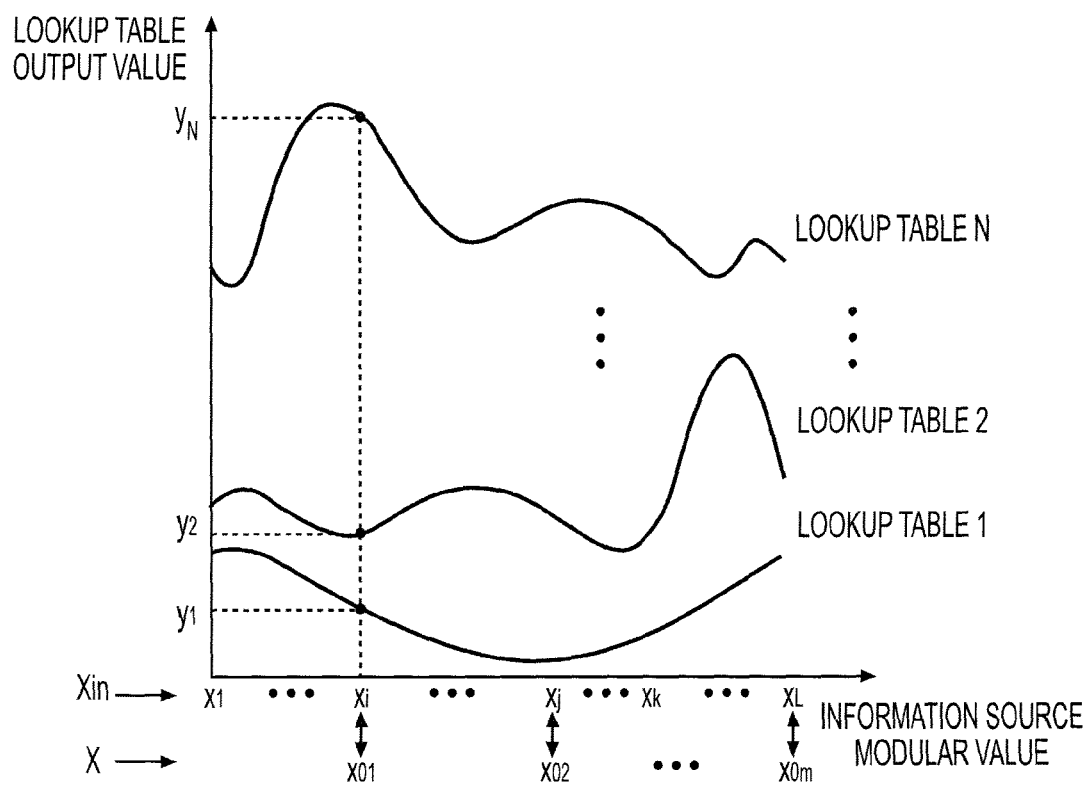
FIG. 4 is a view schematically showing the operation of an orthogonal lookup table value acquiring section in the predistorter according to the present invention.

FIG. 4 is a schematic view showing the operation of an orthogonal lookup table value acquiring section in the predistorter according to the present invention. The abscissa in FIG. 4 is the modular value of the inputted information source signal, and the ordinate is the output value of the lookup table. Each curve in FIG. 4 indicates the content of one lookup table. According to the example in FIG. 4, when the amplitude value (namely modular value) of the inputted information source falls into the interval represented by xi, outputs y1, y2 ... to yN of N lookup tables are simultaneously searched out for future calculation. Xin in FIG. 4 is the representative modular value vector of the information source signal, and it consists of representative amplitude values x1 to xL of the information source. X is the essential point vector, and its elements x01 to x0$m$ are respectively selected from Xin, for instance, x01 is the element xi in Xin. The vectors Xin and X are generated priori, and are used for generation of the orthogonal lookup tables. This will be described later in detail.

Figure 5:
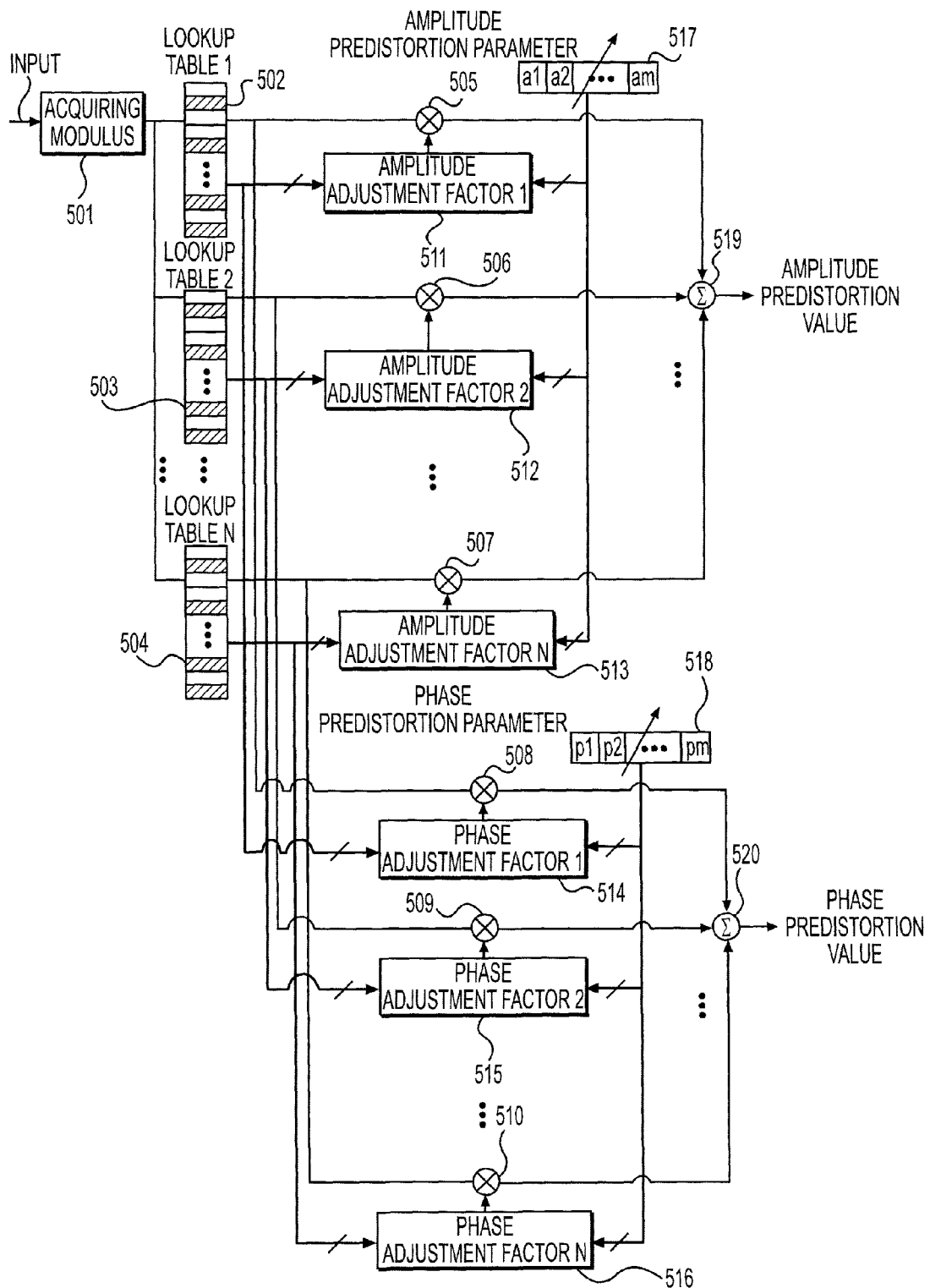
FIG. 5 is a view illustrating in a more detailed manner the predistorter as shown in FIG. 3.

The predistorter as shown in FIG. 3 is described below in a more detailed manner with reference to FIG. 5. FIG. 5 shows the more specific structure of the predistorter in FIG. 3. As shown in FIG. 5, the information source signal inputted from the information source 101 firstly enters a modulus acquiring section 501 to be acquired modulus therein to obtain the modular value of the inputted signal. The modulus acquiring section 501 corresponds to the modular value calculating section 301 in FIG. 3. Subsequently, an orthogonal lookup table value acquiring section (which corresponds to the orthogonal lookup table value acquiring section 302 in FIG. 3) looks up tables in the lookup tables 502, 503 and 504 to obtain a lookup table value that corresponds to the modular value obtained by the modulus acquiring section 501. In FIG. 5, lookup table 1 to lookup table N are orthogonal to one another, that is to say, the inner product of output vectors of any two lookup tables is zero. This set of lookup tables is used not only for amplitude predistortion but also for phase predistortion. Contents in the lookup tables are obtained by calculation in advance and stored, and do not have to be updated in use.

Calculation of contents of the lookup tables is described below in greater detail.

Firstly, the amplitude fluctuation range of the information source signal is uniformly divided into L intervals, the length of each of which is recorded as Δ, in accordance with empirical knowledge concerning the amplitude fluctuation range of the information source signal and a preset lookup table length L. The representative input amplitude value of each interval is determined, and expressed as the representative modular value vector of the information source signal:

$$X_{in}=[x_1, x_2, \ldots, x_L]^T,$$

where $x_i \epsilon [(i-1)\Delta, i\Delta)$ is the representative input amplitude value of the $i^{th}$ interval, L is the length of the lookup table, and the superscript T indicates transposition operation (the same below). According to the L intervals as divided, the representative input amplitude value of the $t_1$ interval, the representative input amplitude value of the $t_2$ interval to the representative input amplitude value of the $t_m$ interval are sequentially selected, and these m amplitude values are used as essential points of predistortion characteristics control. Selection of these intervals can be determined according to engineering experience and empirical knowledge of power amplification characteristics, and the number m of the essential points is determined depending on the demand of computational complexity. Essential point vector X of predistortion characteristics control composed of these essential points is expressed as $$X=[x_{01}, x_{02}, \ldots, x_{0m}]^T,$$

where $x_{0i}$ is the representative input amplitude value of the $t_i^{th}$ interval, namely there are $x_{0i}=X_{in}(t_i)$, $t_i \epsilon(1, L)$, $i=1, \ldots, m$. For instance, the $i^{th}$ amplitude value, the $j^{th}$ amplitude value and the $L^{th}$ amplitude value in FIG. 4 are all selected as essential points.

Nonlinear order N of the corresponding predistortion characteristics is determined according to nonlinear degree of power amplification. The N here determines the number of lookup tables, it is required that N≦m. In order to obtain the orthogonal lookup tables of the predistorter, it is necessary to calculate the matrix M of the following Equation (1), in which the matrix A is composed of the essential point vector of predistortion characteristics control and the high-order power thereof, see Equation (2); the matrix B is composed of the representative modular value of the information source signal and the high-order power thereof, see Equation (3). Since the matrix M is only associated with the modular value of the information source signal, the matrix M is referred to as an input matrix:

$$M = B \cdot (A^T \cdot A)^{-1} \cdot A^T \quad (1)$$

$$\text{where, } A = [1, X, \ldots, X^k, \ldots, X^{N-1}] \quad (2)$$

$$B = [1, X_{in}, \ldots, X_{in}^k, \ldots, X_{in}^{N-1}] \quad (3)$$

As can be seen from Equation (2), the column vector of the matrix A is composed of the $0^{th}$ to the $N-1^{th}$ powers of the essential point vector of predistortion characteristics control, and the powers here include odd powers and even powers. The matrix B is the same.

Singular value decomposition is performed on the matrix M, see Equation (4):

$$M = U \cdot \Sigma \cdot V^T \quad (4)$$

where $$\Sigma = \begin{bmatrix} \Sigma_1 & 0 \\ 0 & 0 \end{bmatrix},$$

and $\Sigma_1 = \text{diag}(\sigma_1, \sigma_2, \ldots, \sigma_N)$; diag($\cdot$) here indicates the diagonal matrix.

Since the nonlinear order of the predistortion characteristics is N, N non-zero singular values $\sigma_i$, i=1, ..., N can be obtained. The matrix U has L column vectors $u_i$, i=1, ..., L, which are referred to as left singular vectors. The matrix V has m column vectors $v_i$, i=1, ..., m, which are referred to as right singular vectors.

According to Equation (5), left singular vectors $u_i$, i=1, ..., N to which N non-zero singular values correspond are selected to generate N orthogonal lookup tables.

$$LUT_i = \sigma_i \cdot u_i, i=1, \ldots, N \quad (5).$$

The orthogonal lookup tables as obtained are stored in a storage unit of the predistorter for use. Taking for example the $i^{th}$ lookup table, its contents are as shown in Table 1:

TABLE 1

| Index | Output |
|---|---|
| $0 \leq |x(n)| < \Delta$ | $\sigma_i \cdot u_i(1)$ |
| $\Delta \leq |x(n)| < 2 \cdot \Delta$ | $\sigma_i \cdot u_i(2)$ |
| $\vdots$ | $\vdots$ |
| $(L-1) \cdot \Delta \leq |x(n)| \leq L \cdot \Delta$ | $\sigma_i \cdot u_i(L)$ |

$|x(n)|$ in Table 1 is the modular value of the input information source signal at timing n, and the index column corresponds to the divided L intervals. In accordance with the interval into which the modular value falls at timing n, the output value of the lookup table at this timing is obtained.

As for the lookup table i, its output values in the index intervals $t_1, t_2 \ldots, t_m$ are elements of the right singular vector $v_i$, which satisfies the following Equation:

$$v_i(j) = \sigma_i \cdot u_i(t_j), i=1, \ldots, N, j=1, \ldots, m \quad (6).$$

The output values $\sigma_i \cdot u_i(t_1), \sigma_i \cdot u_i(t_2), \ldots, \sigma_i \cdot u_i(t_m)$ at these positions will be used in the calculation of the amplitude adjustment factor and the phase adjustment factor, and are referred to as lookup table essential output values, which are shown in the shadowed sections in the lookup tables in FIG. 5. Thus, positions of the lookup table essential output values are decided by selection of the essential points of predistortion characteristics control.

The amplitude predistortion parameters stored in the amplitude predistortion parameter storing section 517 in FIG. 5 are desired amplitude predistortion values at m input amplitude essential points in the essential point vector X of predistortion characteristics control, and are expressed in the form of vector as $V_{am} = [a_1, a_2, \ldots, a_m]^T$.

The phase predistortion parameters stored in the phase predistortion parameter storing section 518 are desired phase predistortion values at m input phase essential points in the essential point vector X of predistortion characteristics control, and are expressed in the form of vector as $V_{pm} = [p_1, p_2, \ldots, p_m]^T$.

N amplitude adjustment factors and N phase adjustment factors in FIG. 5 are calculated as follows. Taking for example amplitude adjustment factor 1, in the amplitude adjustment factor calculating section 511 inner product calculation is performed on the vector composed of the amplitude predistortion parameters and the vector composed of the lookup table essential output value in lookup table 1, and the scalar value obtained thereby is the amplitude adjustment factor 1. Similarly, in the phase adjustment factor calculating section 514 inner product calculation is performed on the vector composed of the phase predistortion parameters and the vector composed of the lookup table essential output value in lookup table 1, and the scalar value obtained thereby is the phase adjustment factor 1. Calculations of other factors are analogous.

In addition, as should be noted, although the amplitude factor calculating section is divided into a plurality of independent amplitude factor calculating sections 511, 512 and 513 in the above embodiments, they can also be realized as a single component part. Similarly, the plurality of independent phase factor calculating sections 514, 515 and 516 as shown in FIG. 5 can also be realized as a single component part.

Thus, N amplitude adjustment factors as obtained are correspondingly multiplied with N lookup table values to obtain N amplitude adjustment values, which are summated to obtain the amplitude predistortion value. Accordingly, amplitude characteristics of the predistorter are expressed as $$Y_{am} = M \cdot V_{am} = \sum_{i=1}^{N} LUT_i \cdot (v_i^T \cdot V_{am}). \quad (7)$$

Similarly, N phase adjustment factors are correspondingly multiplied with N lookup table values to obtain N phase adjustment values, which are summated to obtain the phase predistortion value. Accordingly, phase characteristics of the predistorter are expressed as $$Y_{pm} = M \cdot V_{pm} = \sum_{i=1}^{N} LUT_i \cdot (v_i^T \cdot V_{pm}). \quad (8)$$

Figure 6:
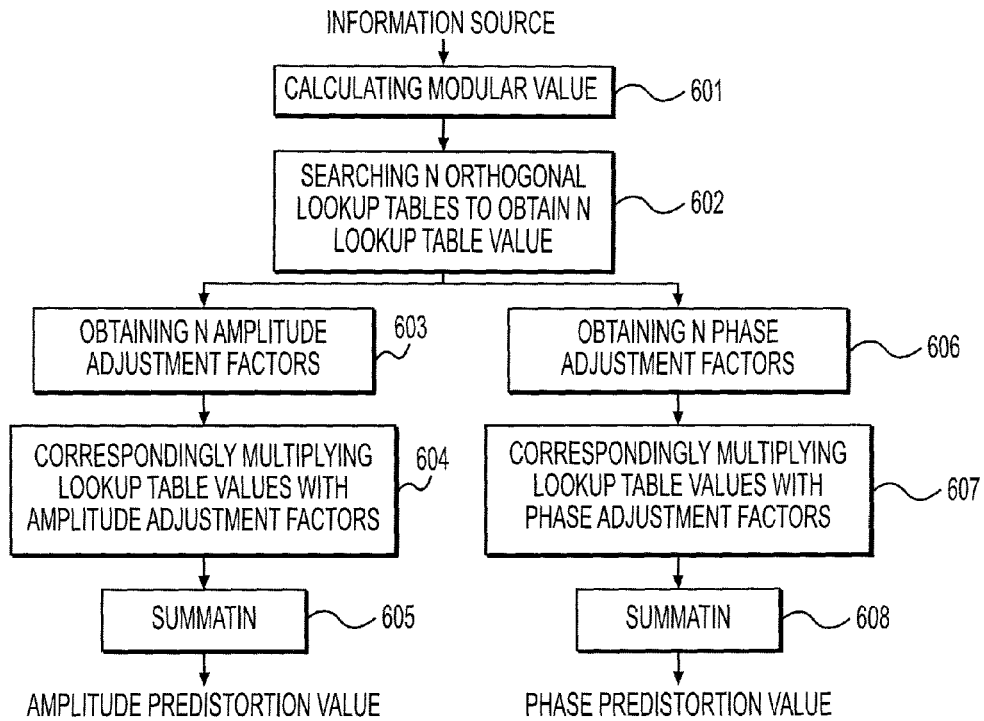
FIG. 6 is a flowchart illustrating the predistortion processing method according to one embodiment of the present invention.

FIG. 6 is a flowchart illustrating the predistortion processing method according to one embodiment of the present invention.

As shown in FIG. 6, the modular value of the inputted information source signal is firstly calculated in Step 601. Then in Step 602, N lookup tables orthogonal to one another are searched to obtain N lookup table values. Then in Step 603, N amplitude adjustment factors are obtained. As previously mentioned, calculation of the amplitude adjustment factors can be carried out by multiplying the amplitude predistortion parameters with the lookup table essential output values in each of the lookup tables. Then in Step 604, the lookup table values obtained in Step 602 are respectively multiplied with the N amplitude adjustment factors obtained in Step 603. Then in Step 605, N multiplying results obtained in Step 604 are added together to obtain the amplitude predistortion value. On the other hand, N phase adjustment factors are obtained in Step 606. As previously mentioned, calculation of the phase adjustment factors can be carried out by multiplying the phase predistortion parameters with the lookup table essential output values in each of the lookup tables. Then in Step 607, the lookup table values obtained in Step 602 are respectively multiplied with the N phase adjustment factors obtained in Step 606. Then in Step 608, N multiplying results obtained in Step 607 are added together to obtain the phase predistortion value.

As should be noted, although in the foregoing descriptions the amplitude predistortion parameter 517 and the phase predistortion parameter 518 are used to calculate the amplitude adjustment factors and the phase adjustment factors, the amplitude adjustment factors and the phase adjustment factors can be calculated and stored after each update of the amplitude predistortion parameter 517 and the phase predistortion parameter 518, and directly multiplied with the lookup table values obtained by looking up the tables and the products are then added to obtain the amplitude predistortion value and the phase predistortion value. It is thus unnecessary to perform calculation of the amplitude adjustment factors and the phase adjustment factors each time. Under such circumstance, update of the predistortion parameters is equivalent to update of the amplitude adjustment factors and the phase adjustment factors.

As should be additionally noted, the above steps can be carried out either in parallel or in sequence.

Figure 7:
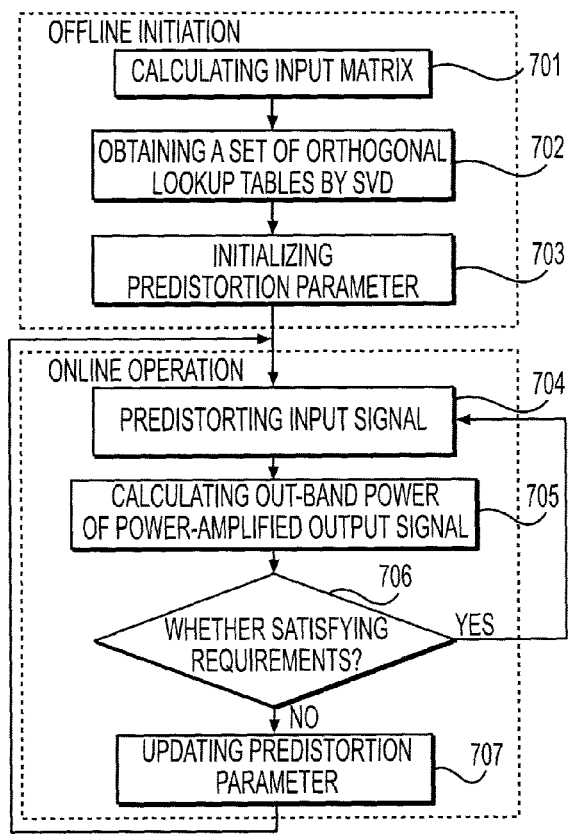
FIG. 7 is an operational flowchart of the predistortion system according to the present invention.

FIG. 7 shows the operational flow of the predistortion system according to the present invention. The operation can be divided into an offline operation phase and an online operation phase. In the offline operation phase, an input matrix M is firstly calculated in Step 701, and the input matrix is then performed with singular value decomposition in Step 702 to obtain a set of orthogonal lookup tables. The predistortion parameters are then initialized in Step 703. The initialized value of the predistortion parameters can be determined in accordance with nonlinear characteristics of typical power amplification as measured. According to one embodiment of the present invention, initialized amplitude adjustment factors and phase adjustment factors are also calculated in the offline operation phase.

The process enters the online operation phase after completion of the offline operation. In Step 704, the input signal is predistorted under the initialized predistortion parameters, as shown in FIG. 6. The output signal from the power amplifier 106 is fed back to the analogue-to-digital converter 108 via a down-converter 107. Then, out-band power of the signal output from the analogue-to-digital converter 108 is calculated in Step 705. It is judged in Step 706 for instance as to whether the out-band power satisfies requirements by a comparison with a threshold value: if yes, the process returns to Step 704 to continue predistortion calculation of the signal under the current predistortion parameter. On the other hand, if it is determined in Step 706 that the requirements are not satisfied, the predistortion parameter is updated in Step 707. In addition, in the case the predistorter according to the present invention directly multiplies the lookup table values obtained by the orthogonal lookup table value acquiring section with the stored amplitude adjustment factors and phase adjustment factors and adds these products to obtain the amplitude predistortion value and the phase predistortion value (i.e., in the case calculation of the amplitude adjustment factors and phase adjustment factors is not performed each time on the amplitude predistortion value and the phase predistortion value), the amplitude adjustment factors and the phase adjustment factors can be directly updated. In the present invention, update of the amplitude predistortion parameter and the phase predistortion parameter is regarded as a specific mode (indirect mode) of updating the amplitude adjustment factors and the phase adjustment factors, and this mode corresponds to the mode (direct mode) of directly updating the amplitude adjustment factors and the phase adjustment factors.

As should be additionally noted, although in the above descriptions as shown in FIG. 1 the down-converter 107, the analogue-to-digital converter 108, the out-band power calculating unit 109 and the predistorter parameter updating module 110 are all listed as parts of the RF power amplification apparatus, these component parts are not necessarily used at each timing, as they can also be periodically used. Therefore, these component parts can be provided independently from such component parts as the predistorter 102 rather than integrated therewith.

Calculation of the out-band power can either be performed in the digital domain as shown in FIG. 1, or performed in the analog domain using an analog filter and a power meter. Taking the digital domain for example, power spectrum of the signal outputted from the analogue-to-digital converter is calculated by such classical power spectrum estimation method (as the Welch method), frequency range occupied by the out-band signal is determined in accordance with the sampling rate of the analogue-to-digital converter, and power spectrum data within this range are integrated to obtain the out-band power value.

Nonlinear characteristics of power amplification vary with such factors as temperature and operating time. When the out-band power does not satisfy the requirement of the threshold, it is necessary to update the predistortion parameter to lower the out-band power. Parameter update can be carried out by such variety of classical adaptive algorithms as the direct search method and the gradient descent method. Taking below the gradient descent method for example, the amplitude predistortion parameter and the phase predistortion parameter are respectively updated as:

$$V_{am}(n+1) = V_{am}(n) - \mu_a \cdot (\partial J(n)/\partial V_{am}) \quad (9)$$

$$V_{pm}(n+1) = V_{pm}(n) - \mu_p \cdot (\partial J(n)/\partial V_{pm}) \quad (10),$$

where $J(n)$ is the out-band power value at the $n^{th}$ step of iteration, $\partial(\cdot)/\partial(\cdot)$ is the operation to obtain partial derivative, and $\mu_a$, $\mu_p$ are update step lengths.

Since the predistortion parameters in the present invention are discrete points on the predistortion curve, varying tendency of the power amplification characteristics with temperature and aging tendency of the power amplification characteristics can be measured by experience, and this is used as empirical knowledge to control the varying tendency and varying range of the predistortion parameters. In the updating process, the amplitude predistortion parameter and the phase predistortion parameter can be updated alternately or simultaneously until the most optimized predistortion parameters are obtained.

As should be noted, the predistorter not only includes odd-order nonlinearity but also includes even-order nonlinearity. When consideration is taken only of the case in which the predistorter includes odd-order nonlinearity, matrixes A and B that constitute input matrixes at this time have the following forms:

$$A = [1, X^2, \ldots, X^{2k}, \ldots, X^{2(N-1)}] \quad (11)$$

$$B = [1, X_{in}^2, \ldots, X_{in}^{2k}, \ldots, X_{in}^{2(N-1)}] \quad (12)$$

where the column vector of the matrix A is composed of even powers of the essential points of predistortion characteristics control, and matrix B is similar. Under such circumstance, the same algorithm also applies.

Moreover, the optimization objective is not merely restricted to the out-band power of the power-amplified output signal, but such functions as the power ratio between in-band/out-band signals can also be used.

As should be noted, the scope of the present invention also covers a computer program that executes the aforementioned predistortion apparatus and predistortion value obtaining method as well as a computer-readable recording medium that records the program. The recording medium can be embodied as a computer-readable floppy disk, a hard disk, a semiconductor memory, a CD-ROM, a DVD, a magnetic optical disk (MO), and other media.

Although the preferred embodiments are merely selected above to illustrate the present invention, it would be easy for persons skilled in the art to make various modifications and variations in accordance with the contents disclosed herein without departing from the inventive scope as defined in the attached claims. Descriptions to the above embodiments are merely exemplary in nature, and should not be understood as restrictions to the invention as defined in the attached claims and analogs thereof.

The invention claimed is:

1. A predistorter, comprising:
   a modular value calculating section, for performing modular arithmetic on an information source input signal inputted from an information source;
   an orthogonal lookup table value acquiring section, for searching N stored lookup tables orthogonal to one another, finding out corresponding output of each lookup table in accordance with the modular value of the information source input signal, and acquiring N lookup table values, wherein N is an integer greater than 1;
   a multiplying section, for multiplying the N lookup table values acquired by the orthogonal lookup table value acquiring section with N amplitude adjustment factors to obtain N amplitude adjustment values, and multiplying the N lookup table values with N phase adjustment factors to obtain N phase adjustment values;
   a summating section, for summating the N amplitude adjustment values to obtain an amplitude predistortion value, and summating the N phase adjustment values to obtain a phase predistortion value.

2. The predistorter according to claim 1, wherein the N lookup tables orthogonal to one another are obtained by performing singular value decomposition (SVD) on an input matrix.

3. The predistorter according to claim 2, wherein the input matrix is obtained by calculating in accordance with a matrix consisting of a predistortion characteristic control essential point vector and high-order powers thereof and a matrix consisting of a representative modular value vector of the information source signal and high-order powers thereof, wherein the high-order powers only include even powers or include not only odd powers but also even powers.

4. The predistorter according to claim 1, wherein each lookup table is marked with a set of lookup table essential output values determined by every predistortion characteristic control essential point;
   the predistorter further comprises an amplitude adjustment factor calculating section, a phase adjustment factor calculating section, an amplitude predistortion parameter storing section and a phase predistortion parameter storing section;
   the amplitude adjustment factor calculating section makes inner product of amplitude predistortion parameters stored in the amplitude predistortion parameter storing section and a vector composed of one set of lookup table essential output values in each lookup table, respectively, to obtain each of the amplitude adjustment factors with regard to each table;
   the phase adjustment factor calculating section makes inner product of phase predistortion parameters stored in the phase predistortion parameter storing section and a vector composed of one set of lookup table essential output values in each lookup table, respectively, to obtain each of the phase adjustment factors with regard to each table;
   the amplitude predistortion parameters are one set of desired amplitude predistortion values at each predistortion characteristic control essential point; and the phase predistortion parameters are one set of desired phase predistortion values at each predistortion characteristic control essential point.

5. A predistortion system, comprising:
   the predistorter according to claim 1;
   an out-of-band power calculating unit, for calculating a feedback out-of-band power value of a signal having been performed with power amplification;
   an adjustment factor updating unit, for updating the amplitude adjustment factors and the phase adjustment factors of the predistorter in accordance with the out-of-band power value calculated by the out-of-band power calculating unit.

6. The predistortion system according to claim 5, wherein in the predistorter each lookup table is marked with a set of lookup table essential output values determined by every predistortion characteristic control essential point;
   the predistorter further comprises an amplitude adjustment factor calculating section, a phase adjustment factor calculating section, an amplitude predistortion parameter storing section and a phase predistortion parameter storing section;
   the amplitude adjustment factor calculating section makes inner product of amplitude predistortion parameters stored in the amplitude predistortion parameter storing section and a vector composed of one set of lookup table essential output values in each lookup table, respectively, to obtain each of the amplitude adjustment factors with regard to each table;
   the phase adjustment factor calculating section makes inner product of phase predistortion parameters stored in the phase predistortion parameter storing section and a vector composed of one set of lookup table essential output values in each lookup table, respectively, to obtain each of the phase adjustment factors with regard to each table;
   the adjustment factor updating unit updates the amplitude predistortion parameters and the phase predistortion parameters.

7. The predistortion system according to claim 6, wherein the adjustment factor updating unit updates the amplitude predistortion parameters and the phase predistortion parameters in accordance with a gradient descent method or a direct search method.

8. A predistorting method, comprising:

performing modular arithmetic on an information source input signal inputted from an information source;

searching N stored lookup tables orthogonal to one another, finding out corresponding output of each lookup table in accordance with the modular value of the information source input signal, and acquiring N lookup table values, wherein N is an integer greater than 1;

multiplying the N lookup table values with N amplitude adjustment factors to obtain N amplitude adjustment values, and multiplying the N lookup table values with N phase adjustment factors to obtain N phase adjustment values;

summating the N amplitude adjustment values to obtain an amplitude predistortion value, and summating the N phase adjustment values to obtain a phase predistortion value.

9. The predistorting method according to claim 8, wherein the N lookup tables orthogonal to one another are obtained by performing singular value decomposition (SVD) on an input matrix.

10. The predistorting method according to claim 8, wherein the input matrix is obtained by calculating in accordance with a matrix consisting of a predistortion characteristic control essential point vector and high-order powers thereof and a matrix consisting of a representative modular value vector of the information source signal and high-order powers thereof, wherein the high-order powers only include even powers or include not only odd powers but also even powers.

* * * * *